United States Patent [19]
Tomita

[11] Patent Number: 5,313,509
[45] Date of Patent: May 17, 1994

[54] PULSE COUNTER WITH ARBITRARY OUTPUT CHARACTERISTIC

[75] Inventor: Shozo Tomita, Tokyo, Japan

[73] Assignee: Oki Electric Industry Co., Ltd., Tokyo, Japan

[21] Appl. No.: 851,780

[22] Filed: Mar. 16, 1992

[30] Foreign Application Priority Data

Mar. 22, 1991 [JP] Japan .................. 3-059206

[51] Int. Cl.$^5$ .............................. H03K 21/38
[52] U.S. Cl. ......................... 377/44; 377/52; 377/56
[58] Field of Search ............. 377/44, 52, 56

[56] References Cited

U.S. PATENT DOCUMENTS

| | | | |
|---|---|---|---|
| 3,930,144 | 12/1975 | Tanaka | 377/44 |
| 3,976,946 | 8/1976 | Schroder | 377/52 |
| 4,017,719 | 4/1977 | Kaplan et al. | 377/52 |
| 4,084,082 | 4/1978 | Alfke | 377/44 |

FOREIGN PATENT DOCUMENTS

0014758 2/1980 Japan.

Primary Examiner—John S. Heyman
Attorney, Agent, or Firm—Spencer, Frank & Schneider

[57] ABSTRACT

A pulse counter has a programmable prescaler that divides the frequency of an input clock pulse signal by a factor designated by a code signal. A counter counts the prescaled clock pulse signal output by the programmable prescaler to generate a count output. A code generator encodes the count output to generate the code signal that controls the programmable prescaler.

18 Claims, 7 Drawing Sheets

| A7 | A6 | A5 | A4 | A3 | A2 | A1 | A0 | C1 | C0 | MODE |
|---|---|---|---|---|---|---|---|---|---|---|
| 0 | 0 | 0 | 0 | 0 | X | X | X | 0 | 0 | |
| 0 | 0 | 0 | 0 | 1 | 0 | X | X | 0 | 0 | 1/16 |
| 0 | 0 | 0 | 0 | 1 | 1 | 0 | X | 0 | 0 | |
| 0 | 0 | 0 | 0 | 1 | 1 | 1 | X | 0 | 1 | |
| 0 | 0 | 0 | 1 | X | X | X | X | 0 | 1 | |
| 0 | 0 | 1 | 0 | 0 | X | X | X | 0 | 1 | 1/6 |
| 0 | 0 | 1 | 0 | 1 | 0 | 0 | X | 0 | 1 | |
| 0 | 0 | 1 | 0 | 1 | 0 | 1 | 0 | 0 | 1 | |
| 0 | 0 | 1 | 0 | 1 | 0 | 1 | 1 | 1 | 0 | |
| 0 | 0 | 1 | 0 | 1 | 1 | X | X | 1 | 0 | |
| 0 | 0 | 1 | 1 | X | X | X | X | 1 | 0 | 1/3 |
| 0 | 1 | X | X | X | X | X | X | 1 | 0 | |
| 1 | 0 | 0 | 0 | 0 | X | X | X | 1 | 0 | |
| 1 | 0 | 0 | 0 | 1 | 0 | X | X | 1 | 0 | |
| 1 | 0 | 0 | 0 | 1 | 1 | X | X | 1 | 1 | |
| 1 | 0 | 0 | 1 | X | X | X | X | 1 | 1 | 1/2 |
| 1 | 0 | 1 | X | X | X | X | X | 1 | 1 | |
| 1 | 1 | X | X | X | X | X | X | 1 | 1 | |

X : DON'T - CARE

PULSE COUNTER WITH ARBITRARY OUTPUT CHARACTERISTIC

BACKGROUND OF THE INVENTION

This invention relates to a pulse counter having an arbitrary monotonic function as an output characteristic.

A pulse counter receives a clock pulse signal and generates a digital output signal having a value related to the number of clock pulses input. In the simplest case the counter increments once for each input pulse, thus counting the number of input pulses; the output characteristic of this counter can be represented by a straight line with unity slope. Alternatively, the counter may be adapted to increment once every N input pulses; in this case the output characteristic is a straight line with a slope of 1/N. For many applications, however, a non-linear output characteristic such as a quadratic or exponential function is required.

Japanese Patent Application Kokai Publication No. 14758/1980 discloses a pulse counter comprising a read-only memory (ROM) and a latch. The latch receives the clock signal, latches low-order bits of the ROM output, and feeds these bit values back to the ROM as address inputs. The output of the pulse counter comprises high-order bits of the ROM output. By programming the ROM with appropriate data, the output characteristic of this pulse counter can be made to approximate an arbitrary mathematical function. A problem, however, is that every output value must be stored in advance in the ROM. To obtain a smooth output characteristic the ROM must store a large amount of data, requiring not only a large number of memory cells but also a large number of address signal lines and a large latch.

The amount of circuitry required can in some cases be reduced by cascading pulse counters of the above type, but this tends to produce another problem: sudden jumps in the output characteristic at points at which the output characteristic changes slope, occurring because the weights of the outputs of the counter stages are not always powers of two.

SUMMARY OF THE INVENTION

It is accordingly an object of the present invention to produce a smooth output characteristic with a small amount of circuitry.

The invented pulse counter has a programmable prescaler that divides the frequency of an input clock signal having clock pulse by a factor designated by a code signal, thus generating a prescaled clock signal having prescaled clock pulses. A counter counts the prescaled clock pulses and generates a count output, which becomes the output of the pulse counter. A code generator encodes the count output of the counter to generate the code signal that controls the programmable prescaler.

DETAILED DESCRIPTION OF THE INVENTION

The invention will be better understood from the following description and attached drawings. The description and drawings are illustrative in nature and do not restrict the scope of the invention, which should be determined solely from the appended claims.

Figure 1:
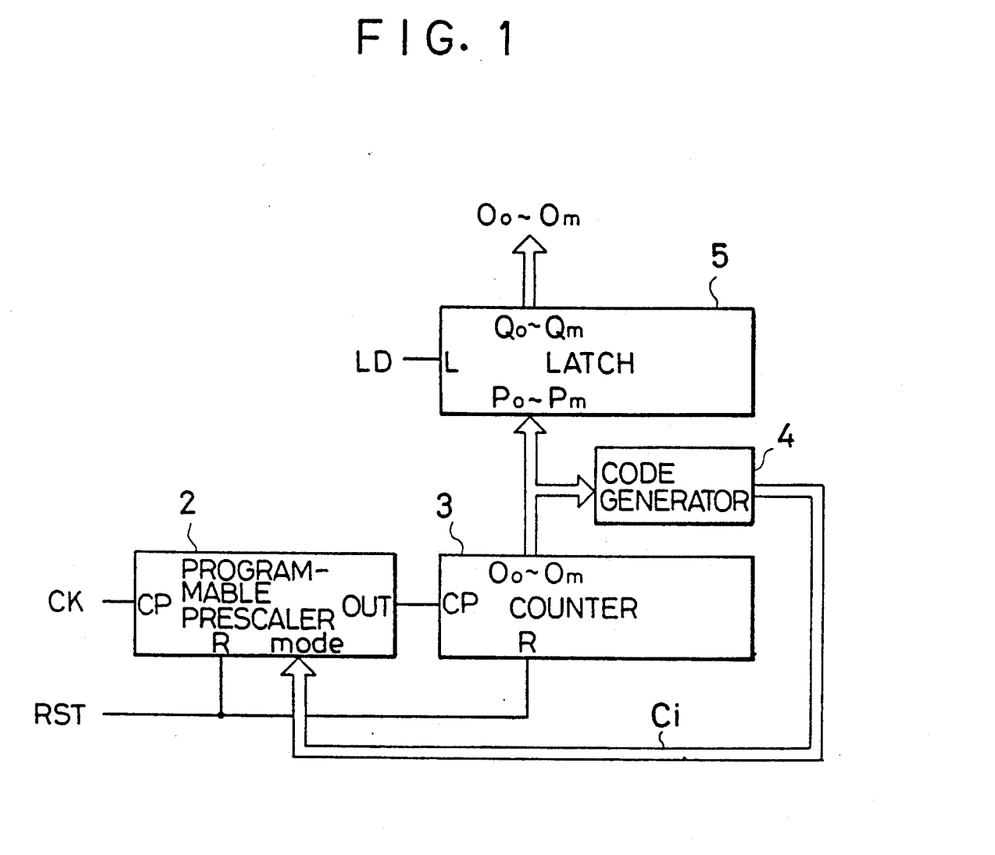
FIG. 1 is a block diagram of the pulse counter according to the invention.

Referring to FIG. 1, the pulse counter according to the invention comprises a programmable prescaler 2, an $m+1$ bit counter 3, a code generator 4, and an $m+1$ bit latch 5. An input clock signal having clock pulses CK is fed to a clock pulse (CP) input terminal of the programmable prescaler 2. A prescaled clock signal having prescaled clock pulses is output from an OUT terminal of the programmable prescaler 2 to a clock pulse (CP) input terminal of the counter 3. The output terminals $O_0$ to $O_m$ of the counter 3 are connected to the code generator 4 and the latch 5. The code generator 4 sends a code signal (Ci) to a mode terminal of the programmable prescaler 2. The latch 5 provides the output of the pulse counter.

The programmable prescaler 2 divides the frequency of the clock pulse signal by a positive integer N, i.e., the programmable prescaler 2 produces one prescaled clock pulse at the OUT terminal for every N clock pulses received at the CP terminal. A reset signal RST input at a reset terminal R initializes the programmable prescaler 2, so that the first output pulse is output from the OUT terminal when the N-th clock pulse CK is input after the reset signal RST. The value of N is selected by the code signal Ci [$i=1, 2, \ldots, n$] input at the mode terminal of the programmable prescaler 2.

The counter 3 is also reset by the reset signal RST. When the reset signal RST is inactive, the counter 3 counts pulses input at its CP terminal and generates corresponding outputs at its output terminals $O_0$ to $O_m$. For example, the counter 3 comprises $m+1$ cascaded T-type flip-flops, generating an $m+1$ bit binary output value $O_0$-$O_m$ that increments once for each input pulse at the CP terminal of the counter 3.

The code generator 4 encodes the $m+1$ bit counter value $O_0$-$O_m$ to generate a binary code signal Ci [$i=1, 2, \ldots, n$] which it returns to the mode terminal of the programmable prescaler 2. The encoding logic depends on the desired output characteristic of the pulse counter.

The latch 5 has $m+1$ input terminals $P_o$ to $P_m$ connected to the output terminals $O_0$ to $O_m$ of the counter 3, and $m+1$ output terminals $Q_0$ to $Q_m$. In response to a load signal LD received at a load input terminal L, the latch 5 latches the outputs $O_0$ to $O_m$ of the counter 3 and provides them as output data from the output terminals $Q_0$ to $Q_m$.

A general description of the operation of this pulse counter will not be given. Following input of a reset signal RST that resets the programmable prescaler 2 and the counter 3, a series of input clock pulses CK is input to the programmable prescaler 2 and prescaled to generate a prescaled clock pulse signal at the OUT terminal, which is counted by the counter 3. The count output by the counter 3 is encoded by the code generator 4 to generate a binary code signal Ci which determines the prescaling mode of the programmable prescaler 2. As a result, the slope of the output characteristic changes. The output $O_0$-$O_m$ of the counter 3 is thus related to the number N of input clock pulses CK as a monotone increasing function f(n) that is generally not linear.

In many applications all that is required is the value of f(n) at the end of the series of CK pulses; the intermediate values are not required. In this case, the load signal LD is activated at the end of the series of input clock pulses CK, causing the latch 5 to latch and output the final count value $O_0$-$O_m$. The RST signal can then be activated to reset the programmable prescaler 2 and the counter 3 in preparation for counting the next series of pulses. When operated in this way the pulse counter always outputs the final count value $O_0$-$O_m$ of the most recent series of pulses.

A more detailed description of the structure and operation of the circuits in FIG. 1 will be given for the case in which the counter 3 is an eight-bit counter (m=7) and the code generator 4 generates a two-bit code $\{C_0, C_1\}$ that selects prescaling modes of ½, ⅓, 1/6, and 1/16 for the programmable prescaler 2. In this description, all signals will be assumed to be active high.

Figure 2:
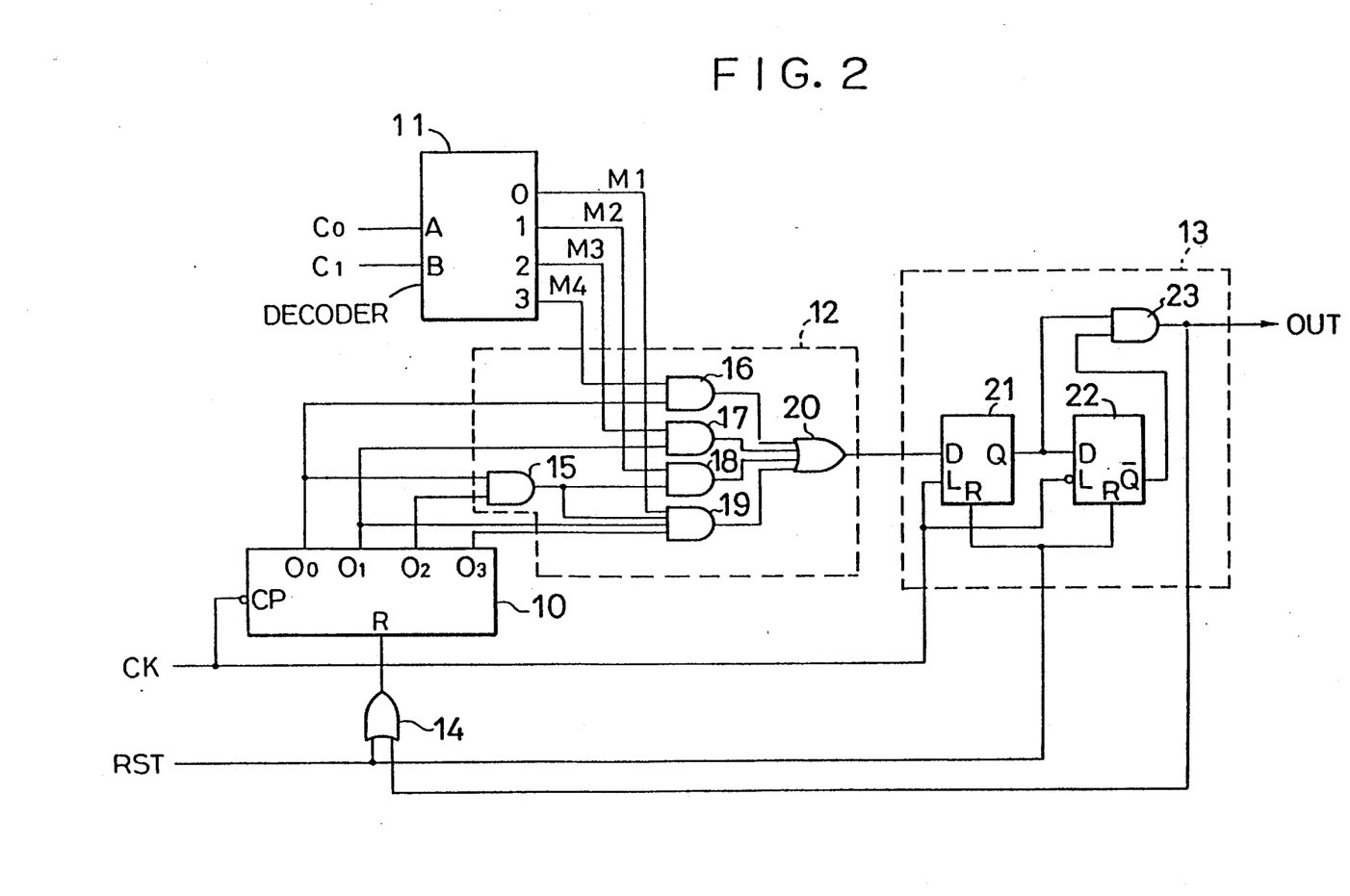
FIG. 2 is a more detailed block diagram illustrating one possible configuration of the programmable prescaler in FIG. 1.

Referring to FIG. 2, the programmable prescaler 2 comprises a counter 10 that receives the input clock signal CK, a decoder 11 that decodes the code signals $C_0$ and $C_1$ to produce four prescale mode signals M1 to M4, a mode selecting circuit 12 that receives the outputs of the counter 10 and the decoder 11, and a divided clock pulse output circuit 13 that receives the output of the mode selecting circuit 12. The output of the divided clock pulse output circuit 13 is the prescaled clock pulse signal output at the OUT terminal in FIG. 1. The output of the divided clock pulse output circuit 13 is also sent to an OR gate 14.

The counter 10 is a four-bit counter with a CP terminal that receives the input clock signal CK, a reset terminal R that receives the output of the OR gate 14, and output terminals $O_0$ to $O_3$. Each pulse input at the CP terminal increments the output count $O_0$–$O_3$ of the counter 10 by one. High input at the reset terminal R clears the output count $O_0$–$O_3$ to zero.

The decoder 11 is a well-known circuit that, for each combination of the code signals $C_0$ and $C_1$, drives just one of the output signals M1 to M4 to the active (high) state.

The mode selecting circuit 12 comprises five AND gates 15 to 19 whose outputs are coincident signals and an OR gate 20 whose output is an instruction signal. These are interconnected so that if M1 is high, the output of the OR gate 20 goes high when the output count $O_0$–$O_3$ of the counter 10 reaches the value fifteen; if M2 is high, the output of the OR gate 20 goes high when the output count $O_0$–$O_3$ reaches the value five; if M3 is high, the output of the OR gate 20 goes high when the output count $O_0$–$O_3$ reaches the value two; and if M4 is high, the output of the OR gate 20 goes high when the output count $O_0$–$O_3$ reaches the value one.

The divided clock pulse output circuit 13 comprises a pair of D-type flip-flops 21 and 22 connected in series. These flip-flops are clocked by transitions at their L terminals, which cause the flip-flop to latch the input at its D terminal and output the latched value at its Q output terminal, or the inverse of the latched value at its $\overline{Q}$ output terminal. The first flip-flop 21 is clocked by the rising edge of the clock pulse signal CK. The second flip-flop 22 is clocked by the falling edge of the clock pulse signal CK. The Q output of the first flip-flop 21 is fed to the D input of the second flip-flop 22. An AND gate 23 receives the Q output of the flip-flop 21 and the $\overline{Q}$ output of the flip-flop 22. The output of the AND gate 23 is fed to the output terminal OUT and to the OR gate 14.

The OR gate 14 also receives the reset signal RST. The RST signal is furthermore provided to reset input terminals R of the flip-flops 21 and 22 in the divided clock pulse output circuit 13.

The operation of the programmable prescaler 2 in FIG. 2 will be briefly described for the case in which $C_0$ is high and $C_1$ is low, this being the code for the 1/6 prescaling mode. In this case the decoder 11 drives M2 high.

Figure 3:
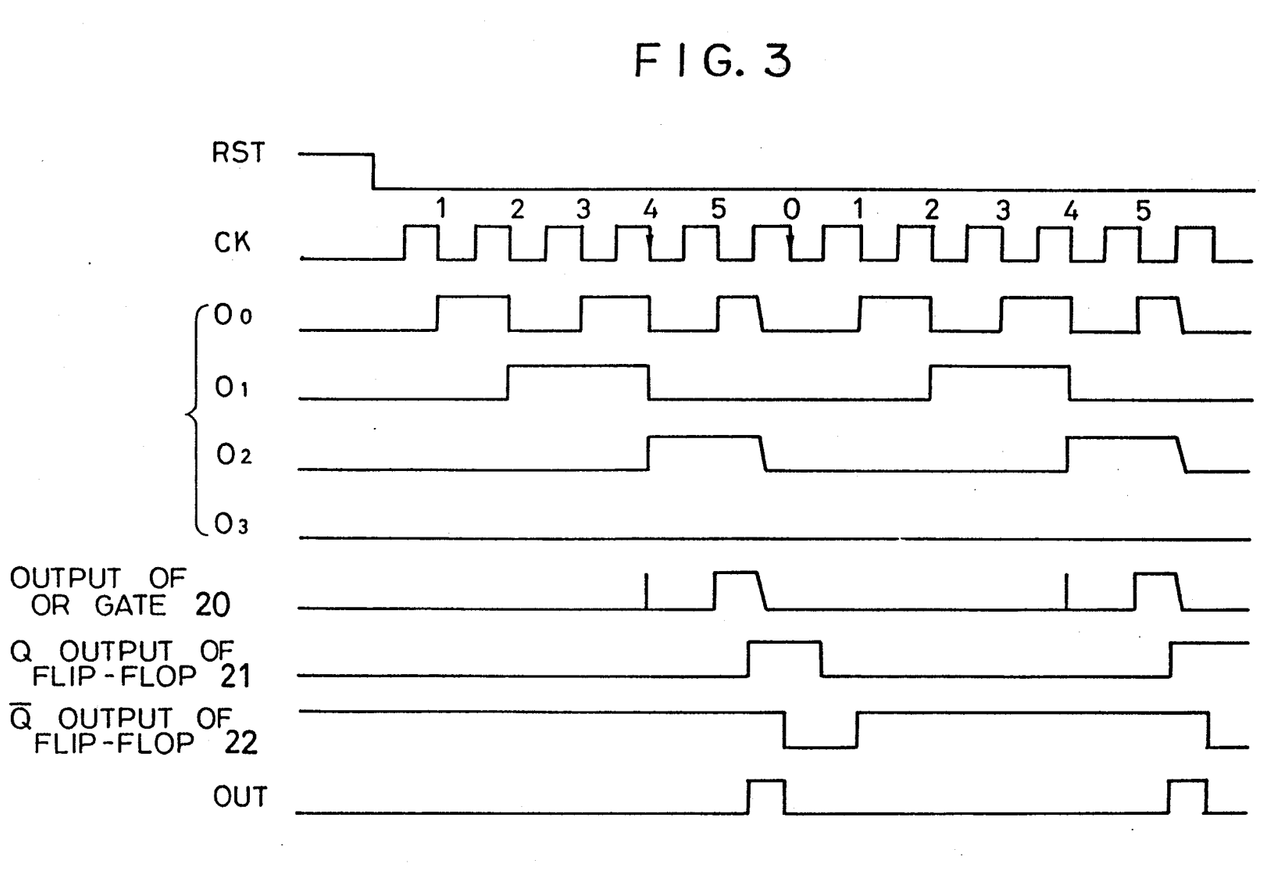
FIG. 3 is a timing diagram illustrating the operation of the programmable prescaler in FIG. 2.

Referring to FIG. 3, the reset signal RST is initially high, resetting the counter 10 and the divided clock pulse output circuit 13. Input of clock pulses CK begins after RST goes low. The counter 10 increments on the falling edge of each clock pulse, as indicated by the changing states of the outputs $O_0$ to $O_3$. At the fifth falling edge of CK, $O_0$ and $O_2$ both become high, so the output of the AND gate 15 goes high. This high output propagates through the AND gate 18 and causes the output of the OR gate 20 to go high.

At the next rising edge of clock pulse signal CK the first flip-flop 21 latches the high output of the OR gate 20, so the Q output of the first flip-flop 21 goes high. The $\overline{Q}$ output of the second flip-flop 22 is also high at this time, so the output signal (OUT) of the AND gate 23 goes high. On the next falling edge of CK, however, the second flip-flop 22 latches the high output of the first flip-flop 21, so the $\overline{Q}$ output of the second flip-flop 22 goes low, hence OUT goes low.

In the meantime the high output of the AND gate 23 has reset the counter 10, so the same process starts again. In this way the programmable prescaler 2 counts repeatedly from zero to five, generating one high OUT pulse every time the count reaches five, thus prescaling the input clock pulse signal CK by a factor of 1/6.

Operation in the other prescaling modes (½, ⅓, and 1/16) selected by the code signals $C_0$ and $C_1$ is analogous, so descriptions will be omitted.

The code generator 4 in FIG. 1 will be described.

Figure 4:
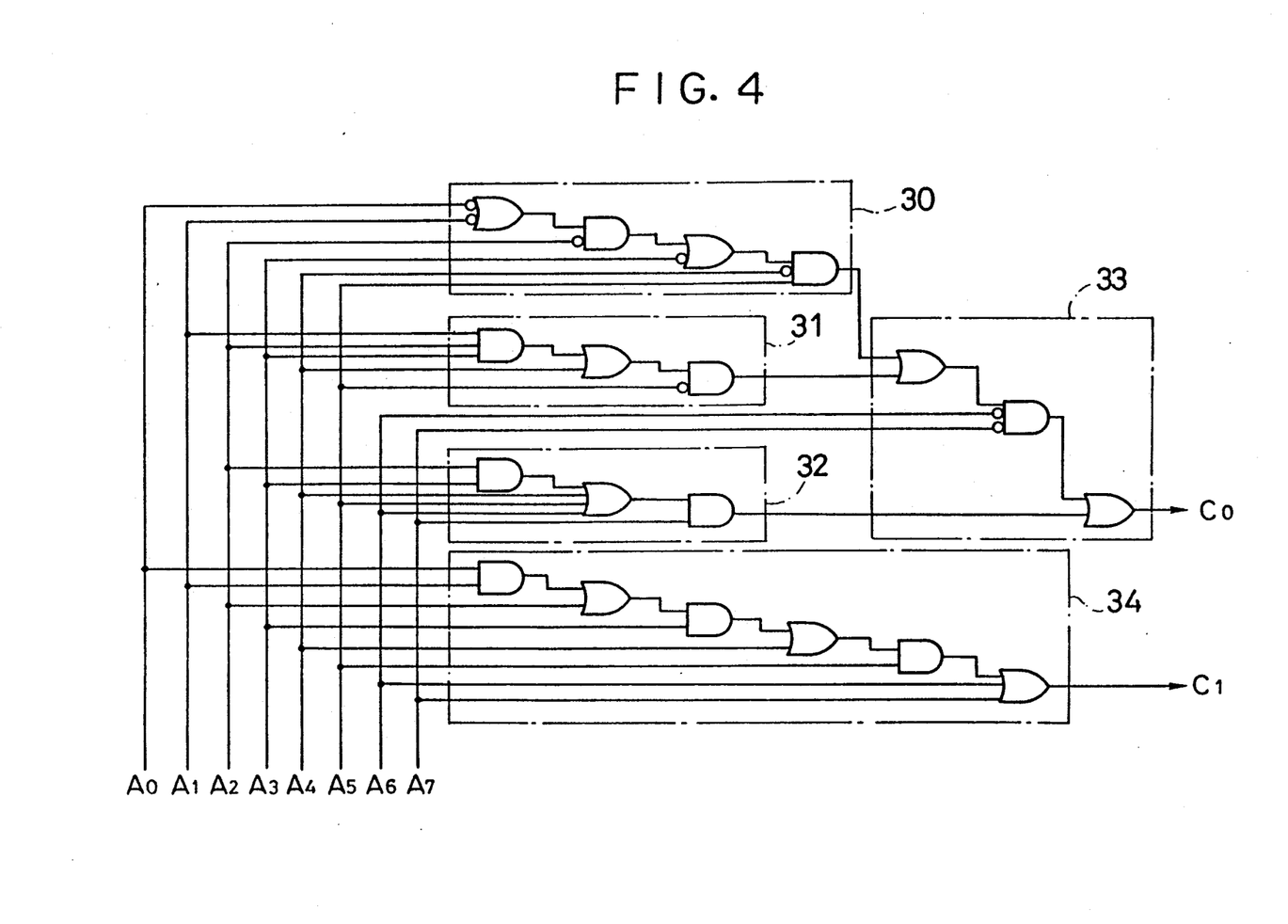
FIG. 4 is a schematic diagram illustrating one possible configuration of the code generator in FIG. 1.

Referring to FIG. 4, the code generator 4 has eight input terminals $A_0$ to $A_7$ that are connected to corresponding output terminals $O_0$ to $O_7$ of the counter 3. The signals received at the input terminals $A_0$ to $A_7$ are fed to logic circuits 30 to 34 comprising AND and OR gates arranged to generate the code signals $C_0$ and $C_1$ according to the following logic formulas:

$$C_0 = \overline{A_7} \cdot \overline{A_6} \cdot \{\overline{A_5} \cdot (A_4 + A_3 \cdot A_2 \cdot A_1) + A_5 \cdot \overline{A_4} \cdot [A_3 + \overline{A_2} \cdot (\overline{A_1} + \overline{A_0})]\} + A_7 \cdot (A_6 + A_5 + A_4 + A_3 \cdot A_2)$$
$$C_1 = A_7 + A_6 + A_5 \cdot [A_4 + A_3 \cdot (A_2 + A_1 \cdot A_0)]$$

$$C_1 = A_7 + A_6 + A_5 \cdot [A_4 + A_3 \cdot (A_2 + A_1 \cdot A_0)]$$

where $\overline{A_n}$ designates the logical negation of $A_n$, a plus sign (+) designates the logical OR operation, and a dot (.) designates the logical AND operation.

Figure 5:
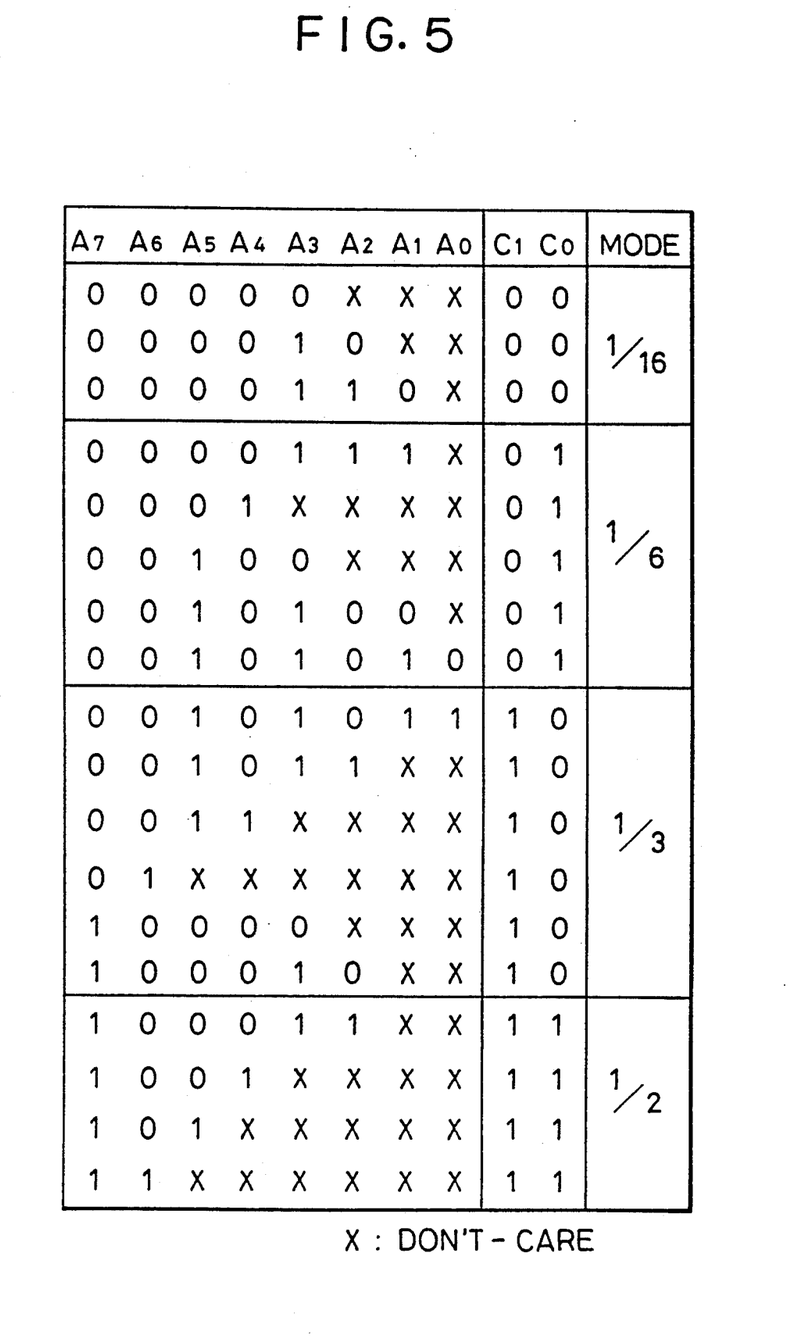
FIG. 5 is a truth table illustrating the operation of the code generator in FIG. 5.

The operation of the counter 3 in FIG. 4 is summarized in the truth table in FIG. 5. Zero indicates the low state, one indicates the high state, and X indicates the don't-care state.

Figure 6:
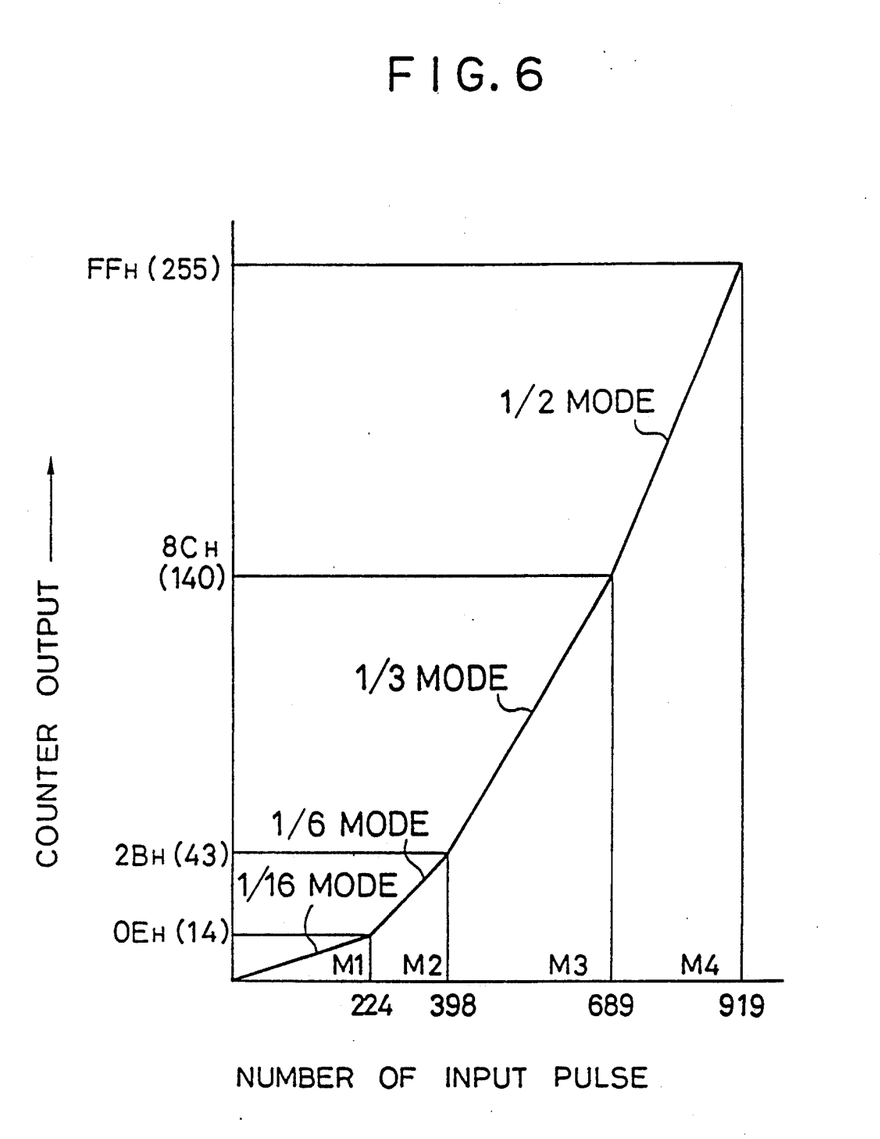
FIG. 6 is a graph of the output characteristic of the pulse counter illustrated in FIGS. 1 to 5.

FIG. 6 illustrates the combined operation of the circuits described above, showing the number of clock pulses CK on the horizontal axis in decimal notation and the count value $O_0$-$O_7$ output by the counter 3 on the vertical axis in hexadecimal and decimal notation. Following input of a reset signal, the signals $O_0$-$O_7$, $C_0$, and $C_1$ are all low, so the M1 signal is high and the programmable prescaler 2 operates in 1/16 prescaling mode.

When the 224th pulse is input, the count value $O_0$-$O_7$ changes from hexadecimal 0D to hexadecimal 0E (decimal 14=224/16), which is 00001110 in binary notation. As FIG. 5 indicated, this results in $C_0=1$, $C_1=0$, driving M1 low and M2 high. The programmable prescaler 2 now operates in 1/6 prescaling mode.

When the 398th pulse is input the output count reaches hexadecimal 2B, which the code generator 4 encodes to $C_0=0$ and $C_1=1$. The prescaling mode now changes to ⅓, M2 going low and M3 high. Similarly, when the 689th pulse is input the output count reaches hexadecimal 8C, which the code generator 4 encodes to $C_0=1$ and $C_1=1$. The prescaling mode now changes to ½, M3 going low and M4 high. The pulse counter continues to operate in ½ mode (M4) through the highest count of hexadecimal FF.

As can be seen in FIG. 6, the resulting output characteristic is approximates a quadratic function. The characteristic is smooth in that there are no sudden jumps at points where the mode changes.

Figure 7:
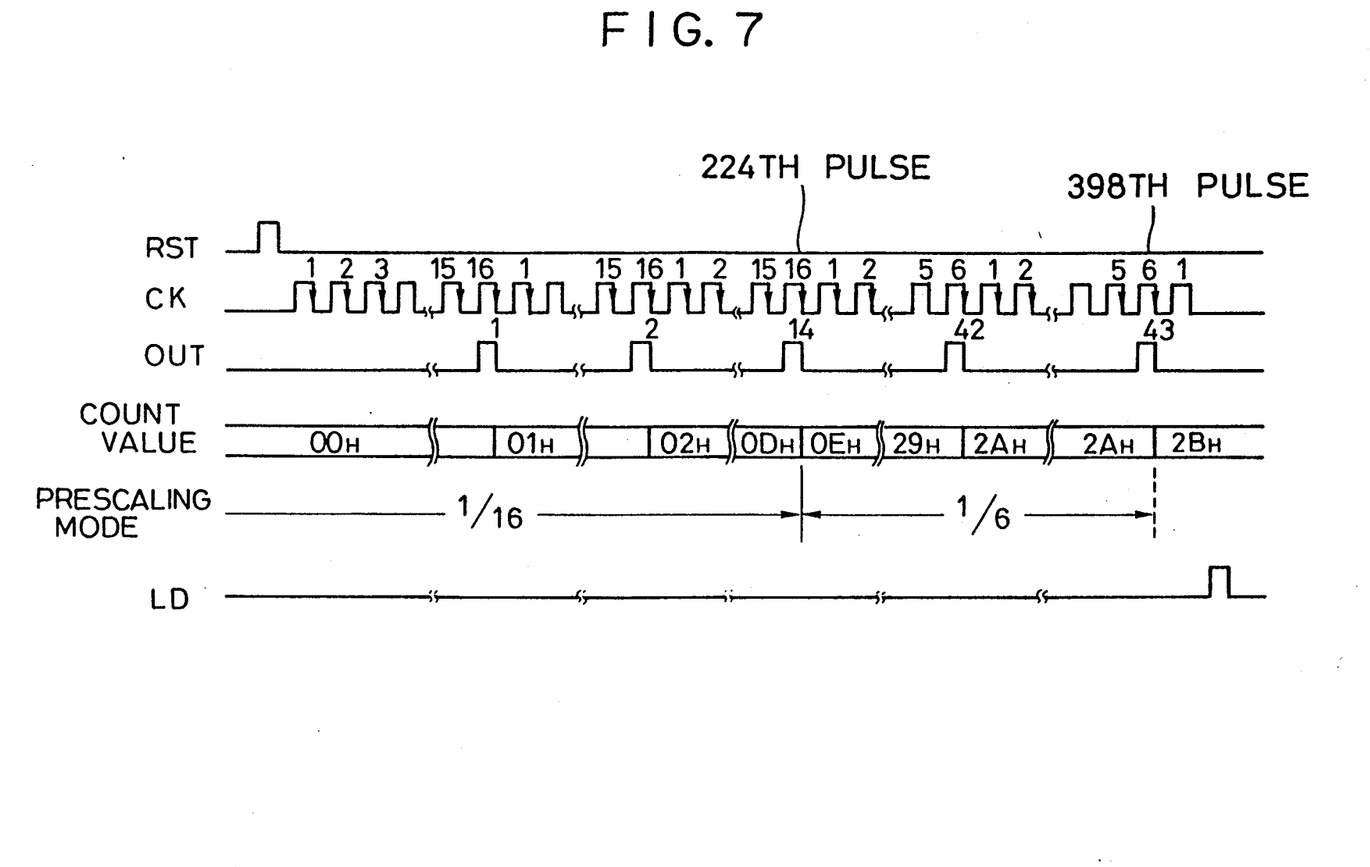
FIG. 7 is a timing diagram illustrating the operation of the pulse counter illustrated in FIGS. 1 to 5.

FIG. 7 illustrates the operation of the pulse counter in the form of a timing diagram, showing the input clock pulse signal CK, the prescaled clock pulses output from the OUT terminal of the programmable prescaler 2, the hexadecimal values in the counter 3 which counts these prescaled clock pulses, and the ranges of these values that correspond to the 1/16 and 1/6 prescaling modes. The load signal LD can be driven high at an arbitrary time to obtain the count value from the latch 5 in FIG. 1.

The programmable prescaler 2, the counter 3, and the code generator 4 in FIG. 1 require only standard counter circuits employing T-type flip-flops and a few additional flip-flops and logic gates. Taken together, they are much smaller than the ROM of the prior art that stored an individual output value for each number of input clock pulses.

The invention is of course not limited to the output characteristic shown in FIG. 6. The prescaling modes of the programmable prescaler 2, the bit length of the counter 3, and the logic operations performed by the code generator 4 can be altered to approximate any desired monotonic output characteristic with any desired accuracy. The output characteristic does not need to be monotone increasing; it can be monotone decreasing if the counter 3 is a down counter. Moreover, the code generator 4 does not need to be configured from logic gates as shown in FIG. 4; it can alternatively be structured, for example, as a small read-only memory.

What is claimed is:

1. A pulse counter comprising:
    a first counter including a clock terminal for receiving an input clock signal having a plurality of clock pulses and a reset terminal for receiving a prescaled clock signal having a plurality of prescaled clock pulses, said first counter counting the clock pulses of the input clock signal to produce a first count signal, and being initialized by the prescaled clock pulses of the prescaled clock signal;
    a decoder for receiving a code signal and producing a prescale mode signal in response to the code signal;
    a mode selecting circuit, coupled to said first counter and said decoder, for producing an instruction signal in response to the prescale mode signal and the first count signal;
    a divided clock pulse output circuit, coupled to said mode selecting circuit and said first counter, for producing the prescaled clock pulses of the prescaled clock signal in response to the clock pulses of the input clock signal and the instruction signal;
    a second counter, coupled to said divided clock pulse output circuit, for counting the prescaled clock pulses of the prescaled clock signal to produce a second count signal;
    a code generator, coupled between said second counter and said decoder, for producing the code signal in response to the second count signal; and
    a latch circuit, coupled to said second counter, for receiving a latch signal and the second count signal, and for latching the second count signal in response to the latch signal.

2. A pulse counter according to claim 1, wherein said divided clock pulse output circuit comprises a plurality of flip-flop circuits connected in series and a logic gate, said logic gate having an output terminal coupled to the reset terminal of said first counter and a plurality of input terminals, each of said input terminals being connected to a respective output terminal of the flip-flop circuits.

3. A pulse counter according to claim 1, wherein said mode selecting circuit comprises a plurality of logic gates.

4. A pulse counter according to claim 3, wherein said plurality of logic gates comprises a first and a second logic gate section, said first logic gate section receiving the first count signal and the prescale mode signal and producing a coincident signal only if the prescale mode signal corresponds to the first count signal, and said second logic gate section receiving the coincident signal and producing the instruction signal.

5. A pulse counter comprising:
    a first counter including a clock terminal for receiving an input clock signal having a plurality of clock pulses and a reset terminal for receiving a prescaled clock signal having a plurality of prescaled clock pulses, said first counter counting the clock pulses of the input clock signal to produce a first count signal having a first count value corresponding to the counted clock pulses of the input clock signal, and being initialized by the prescaled clock pulses of the prescaled clock signal;
    a decoder for receiving a code signal having a code value and producing a prescale mode signal having a prescale mode value corresponding to the code value;
    a mode selecting circuit, coupled to said first counter and said decoder, for producing an instruction signal in response to the prescale mode value and the first count value;
    a divided clock pulse output circuit, coupled to said mode selecting circuit and said first counter, for producing the prescaled clock pulses of the prescaled clock signal in response to the clock pulses of the input clock signal and the instruction signal;

a second counter, coupled to said divided clock pulse output circuit, for counting the prescaled clock pulses of the prescaled clock signal to produce a second count signal having a second count value;

a code generator, coupled between said second counter and said decoder, for producing the code signal in response to the second count value; and a latch circuit, coupled to said second counter, for receiving a latch signal and the second count signal, and for latching the second count value in response to the latch signal.

6. A pulse counter according to claim 5, wherein said divided clock pulse output circuit comprises a plurality of flip-flop circuits connected in series and a logic gate, said logic gate having an output terminal coupled to the reset terminal of said first counter and a plurality of input terminals, each being connected to a respective output terminal of the flip-flop circuits.

7. A pulse counter according to claim 5, wherein said mode selecting circuit comprises a plurality of logic gates.

8. A pulse counter according to claim 7, wherein said plurality of logic gates comprises a first and a second logic gate section, said first logic gate section receiving the first count signal and the prescale mode signal and producing a coincident signal only if the prescale mode value corresponds to the first count value, and said second logic gate section receiving the coincident signal and producing the instruction signal.

9. A pulse counter according to claim 5, wherein said code generator outputs the code signal such that the second count value as a function of the number of clock pulses of the input clock signal approximates a quadratic function.

10. A pulse counter according to claim 5, wherein said code generator outputs the code signal such that the second count value as a function of the number of clock pulses of the input clock signal is a monotone increasing function.

11. A pulse counter according to claim 5, wherein said code generator outputs the code signal such that the second count value as a function of the number of clock pulses of the input clock signal is a monotone decreasing function.

12. A pulse counter, which does not include an electronic storage device, comprising:

a first counter including a clock terminal for receiving an input clock signal having a plurality of clock pulses and a reset terminal for receiving a prescaled clock signal having a plurality of prescaled clock pulses, said first counter counting the clock pulses of the input clock signal to produce a first count signal having a first count value corresponding to the counted clock pulses of the input clock signal, and being initialized by the prescaled clock pulses of the prescaled clock signal;

a decoder for receiving a code signal having a code value and producing a prescale mode signal having a prescale mode value corresponding to the code value;

a mode selecting circuit, coupled to said first counter and said decoder, for producing an instruction signal in response to the prescale mode value and the first count value;

a divided clock pulse output circuit, coupled to said mode selecting circuit and said first counter, for producing the prescaled clock pulses of the prescaled clock signal in response to the clock pulses of the input clock signal and the instruction signal;

a second counter, coupled to said divided clock pulse output circuit, for counting the prescaled clock pulses of the prescaled clock signal to produce a second count signal having a second count value;

a code generator, coupled between said second counter and said decoder, for producing the code signal in response to the second count value; and a latch circuit, coupled to said second counter, for receiving a latch signal and the second count signal, and for latching the second count value in response to the latch signal.

13. A pulse counter according to claim 12, wherein said divided clock pulse output circuit comprises a plurality of flip-flop circuits connected in series and a logic gate, said logic gate having an output terminal coupled to the reset terminal of said first counter and a plurality of input terminals, each being connected to a respective output terminal of the flip-flop circuits.

14. A pulse counter according to claim 12, wherein said mode selecting circuit comprises a plurality of logic gates.

15. A pulse counter according to claim 14, wherein said plurality of logic gates comprises a first and a second logic gate section, said first logic gate section receiving the first count signal and the prescale mode signal and producing a coincident signal only if the prescale mode value corresponds to the first count value, and said second logic gate section receiving the coincident signal and producing the instruction signal.

16. A pulse counter according to claim 12, wherein said code generator outputs the code signal such that the second count value as a function of the number of clock pulses of the input clock signal approximates a quadratic function.

17. A pulse counter according to claim 12, wherein said code generator outputs the code signal such that the second count value as a function of the number of clock pulses of the input clock signal is a monotone increasing function.

18. A pulse counter according to claim 12, wherein said code generator outputs the code signal such that the second count value as a function of the number of clock pulses of the input clock signal is a monotone decreasing function.

* * * * *